(12) United States Patent
Hsu

(10) Patent No.: US 8,153,490 B2
(45) Date of Patent: Apr. 10, 2012

(54) FABRICATION METHOD OF POWER SEMICONDUCTOR STRUCTURE WITH REDUCED GATE IMPEDANCE

(75) Inventor: Hsiu Wen Hsu, Hsinchu County (TW)

(73) Assignee: Great Power Semiconductor Corp., Xizhi (TW)

( * ) Notice: Subject to any disclaimer, the term of this patent is extended or adjusted under 35 U.S.C. 154(b) by 18 days.

(21) Appl. No.: 12/860,054

(22) Filed: Aug. 20, 2010

(65) Prior Publication Data
US 2012/0045877 A1 Feb. 23, 2012

(51) Int. Cl.
*H01L 21/336* (2006.01)
(52) U.S. Cl. .......... 438/270; 438/589; 257/301
(58) Field of Classification Search .......... 438/270, 438/589; 257/301
See application file for complete search history.

(56) References Cited

U.S. PATENT DOCUMENTS

| 6,989,306 | B2 * | 1/2006 | Chuang et al. | 438/270 |
| 7,084,457 | B2 * | 8/2006 | Hsieh et al. | 257/329 |
| 2010/0078714 | A1 * | 4/2010 | Tu et al. | 257/330 |

* cited by examiner

*Primary Examiner* — Phuc Dang
(74) *Attorney, Agent, or Firm* — C. G. Mersereau; Nikolai & Mersereau, P.A.

(57) ABSTRACT

A fabrication method of a power semiconductor structure with reduced gate impedance is provided. Firstly, a polysilicon gate is formed in a substrate. Then, dopants are implanted into the substrate with the substrate being partially shielded by the polysilicon gate. Afterward, an isolation layer is formed to cover the polysilicon gate. Thereafter, a thermal drive-in process is carried out to form at least a body surrounding the polysilicon gate. Then, the isolation layer is removed to expose the polysilicon gate. Afterward, a metal layer is deposited on the dielectric layer and the polysilicon gate, and a self-aligned silicide layer is formed on the polysilicon gate by using a thermal process.

9 Claims, 5 Drawing Sheets

FABRICATION METHOD OF POWER SEMICONDUCTOR STRUCTURE WITH REDUCED GATE IMPEDANCE

BACKGROUND OF THE INVENTION (1) Field of the Invention

This invention relates to a fabrication method of a power semiconductor structure, and more particularly relates to a fabrication method of a power semiconductor with reduced gate impedance.

(2) Description of the Prior Art

Energy conservation is an important issue nowadays. The trend of energy conservation encourages the settlement of strict energy efficiency standards, which brings a severe challenge for the developers of power converters. To meet this challenge, the new power device, such as the power MOSFET, plays an important role and has been widely applied to various power converters.

FIGS. 1A to 1C are schematic cross-section views showing the fabrication method of a typical trenched power semiconductor structure. An N-type trenched power MOSFET is described below for example. As shown in FIG. 1A, firstly, an N-type silicon substrate 110 is provided, and then a mask (not shown) is utilized to define the location of gate trenches 120 in the silicon substrate 110. The gate trenches 120 are then formed in the N-type silicon substrate 110 by dry etching. Thereafter, a gate oxide layer 130,132 is formed on the exposed surfaces of the N-type silicon substrate 110.

Next, a polysilicon layer is deposited over the N-type silicon substrate 110 to fill the gate trenches 120. Then, the portion of the polysilicon layer on the upper surface of the N-type silicon substrate 120 is removed by etching back to leave a plurality of polysilicon gates 140 located in the gate trenches 120. Thereafter, as shown in FIG. 1B, a blanket ion implantation is carried out to implant P-type dopants in the N-type silicon substrate 110 to form a doped region 150. Then, as shown in FIG. 1C, the implanted P-type dopants are driven in the silicon substrate 110 by annealing so as to form a P-body 150' in the N-type silicon substrate 110.

When scaling down the cell dimension of MOSFETs for a higher integration, the resistance of the polysilicon gate 140 is increased due to a narrower and shallower gate trench 120. The switching speed of the transistor would be badly influenced by the increased gate resistance and a greater switching loss is resulted.

The resistance of polysilicon material can be quite high, which is usually greater than 1 mΩ-cm, in respective with the metal material. In order to reduce the resistance of the polysilicon gate 140, a typical method is to form low resistance silicide on the polysilicon gate 140.

As to the fabrication process of typical self-aligned silicide (salicide), the timing of the fabrication step of the silicide layer should be postponed until the ion implantation steps and the thermal drive-in steps are finished, such that the unwanted diffusion of metal ions under high temperature to result in pollution can be prevented and the thickness of the silicide layer can be well-controlled. However, as shown in FIGS. 1B and 1C, the drive-in step is usually performed in oxygen ambient, which may result in the formation of the oxide layer on the surface of the polysilicon gate 140. In addition, the oxide layer 134 formed on the polysilicon gate 140 with high density dopants is always thicker than the oxide layer 132' on the surface of the silicon substrate 120.

The oxide layers 134, 132' may hinder the formation of silicide. Thus, as shown in FIG. 1C, to form self-aligned silicide (salicide), the oxide layer 134 on the polysilicon gate 140 should be removed but the oxide layer 132' should be kept on the silicon substrate 110. However, as mentioned above, because the thickness of the oxide layer 134 on the polysilicon gate 140 is greater than the oxide layer 132' on the silicon substrate 110, it is difficult to selectively remove the oxide layer 134 on the polysilicon gate 140 but leave the oxide layer 132' on the silicon substrate 110 merely by etching.

SUMMARY OF THE INVENTION

It is an object of the present invention to provide a fabrication method of a power semiconductor structure capable of forming the self-aligned silicide (salicide) layer on the polysilicon gate for reducing gate impedance of the power semiconductor structure.

A fabrication method of a power semiconductor structure with reduced gate impedance is provided in accordance with an embodiment of the present invention. Firstly, a polysilicon gate is formed in a substrate. The polysilicon gate may be a trenched polysilicon gate or a planar one. Then, dopants are implanted into the substrate with the substrate being partially shielded by the polysilicon gate. Afterward, an isolation layer is formed to cover the polysilicon gate. Thereafter, a thermal drive-in process is carried out to form at least a body surrounding the polysilicon gate. Then, the isolation layer is removed to expose the polysilicon gate. Afterward, a metal layer is deposited on the dielectric layer and the polysilicon gate, and a self-aligned silicide (salicide) layer is formed on the polysilicon gate by using a thermal process.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The main feature of the present invention is to deposit a silicon nitride layer previous to the thermal drive-in process, so as to make sure a clear upper surface on the polysilicon gate without oxide layer thereon is maintained after the following body drive-in and source drive-in steps. Thereby, the silicon oxide layer on the silicon substrate can be utilized as a mask for the formation of self-aligned silicide (salicide) layer on the polysilicon gate for reducing gate resistance. It is well understood that the idea of the present invention can be applied to both the trenched polysilicon gate and the planar one. Since the planar one is simpler in structure than the trenched one, the fabrication method of the trenched power polysilicon structure is described below for a better understanding of the present invention.

Figure 1A:
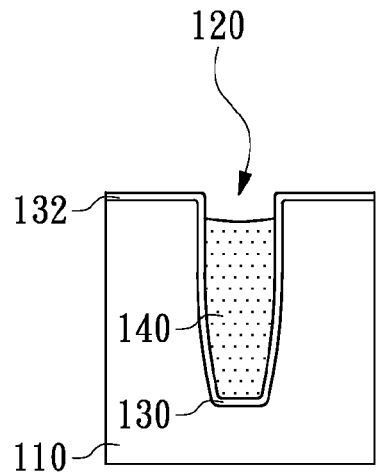
FIGS. 1A to 1C are schematic cross-section views showing a fabrication method of a typical trenched power semiconductor structure.
Figure 1B:
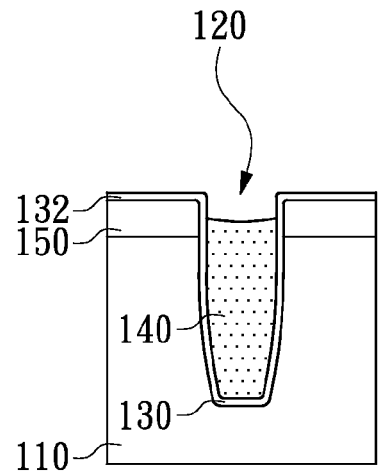
Figure 1C:
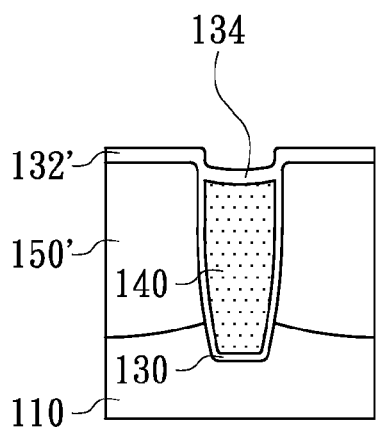
Figure 2A:
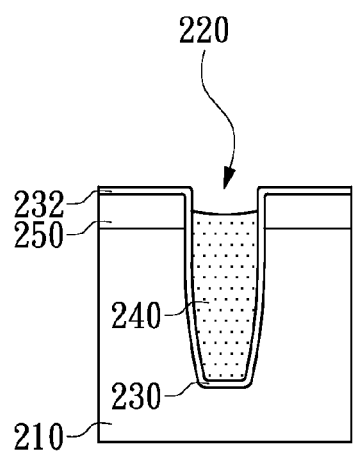
FIGS. 2A to 2F are schematic cross-section views showing a fabrication method of a trenched power semiconductor structure with reduced gate impedance in accordance with a first embodiment of the present invention.

FIGS. 2A to 2F are schematic cross-section views showing a fabrication method of a trenched power semiconductor structure with reduced gate impedance in accordance with a first embodiment of the present invention. As shown in FIG. 2A, a gate trench 220 is firstly formed in a silicon substrate 210. Then, a dielectric layer 230,232 is formed on exposed surfaces of the silicon substrate 210, which includes the inner surface of the gate trench 220 and the upper surface of the silicon substrate 210. The dielectric layer 230,232 may be formed of silicon oxide, silicon nitride, or other adequate dielectric materials. Thereafter, a polysilicon gate 240 is formed in the gate trench 220. Then, a doped region 250 is formed by implanting dopants of first conductive type into the silicon substrate 210 with the silicon substrate being partially shielded by the polysilicon gate 240.

Figure 2B:
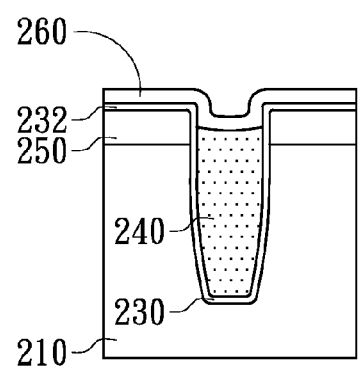

Next, as shown in FIG. 2B, an isolation layer 260 is conformally formed on the silicon substrate 210 and the polysilicon gate 240. The isolation layer 260 is functioned to isolate the polysilicon gate 240 from the environmental gas, for example, oxygen. As a preferred embodiment, the isolation layer 260 may be formed of silicon nitride.

Figure 2C:
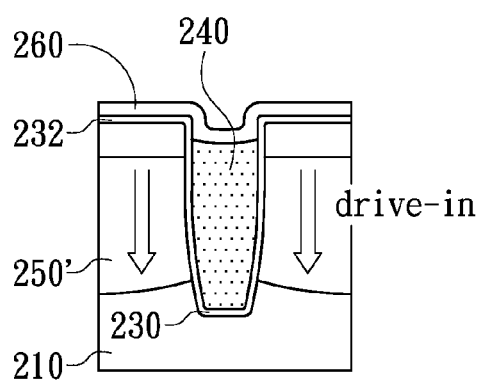

Next, as shown in FIG. 2C, a thermal drive-in step is carried out focusing on the implanted first conductive type dopants in the doped region 250 indicated by the dashed line. As indicated by the arrow, the dopants within the doped region 250 are chiefly diffused downward to compose a body 250' surrounding the polysilicon gate 240.

Figure 2D:
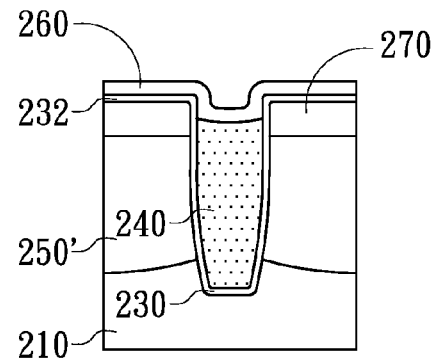

Next, as shown in FIG. 2D, a source implantation step is carried out for implanting dopants of second conductive type through the dielectric layer 232 and the isolation layer 260 into the body 250'. Thereafter, another thermal drive-in step is performed to form the source region 270 at the surface region of the silicon substrate 210.

Figure 2E:
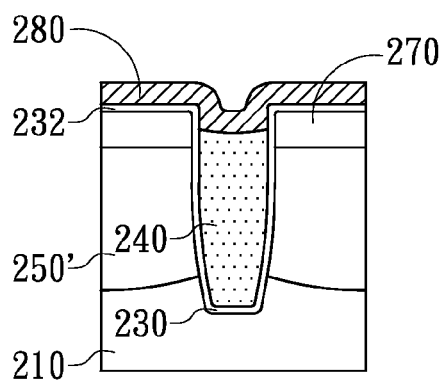

Next, as shown in FIG. 2E, the isolation layer 260 is removed to expose the dielectric layer 232 on the upper surface of the silicon substrate 210 and the upper surface of the polysilicon gate 240. Then, a metal layer 280 is deposited on the dielectric layer 232 and the polysilicon gate 240. After the deposition of the metal layer 280, an annealing process, such as the rapid thermal annealing (RTA) process, is performed to have the metal layer 280 reacting with the polysilicon gate 240 so as to form the self-aligned silicide (salicide) layer 285 at the interface between the polysilicon gate 240 and the metal layer 280. Thereafter, the unwanted portion of the metal layer 280, the unreacted portion for example, is removed. The following fabrication steps, such as the step of forming the source contact window, are not the patentable feature of the present invention and are well known for people in the art, and thus are not described here.

In the fabrication method of traditional trenched power semiconductor structure, the silicon oxide layer 134 on the polysilicon gate 140 to retard the formation of silicide would be unpreventable due to the existence of the ion implantation step and the adjacent thermal drive-in step. In addition, because the thickness of the silicon oxide layer 134 on the polysilicon gate 140 is always greater than the silicon oxide layer 132' on the silicon substrate 110, it is difficult to selectively remove the silicon oxide layer 134 merely by etching to leave the silicon oxide layer 132' on the silicon substrate 110 as the mask for forming the self-aligned silicide (salicide) layer.

In contrast, as shown in FIG. 2B, in accordance with the present embodiment, the isolation layer 260 deposited on the polysilicon gate 240 just after the ion implantation step is capable of preventing the formation of silicon oxide on the polysilicon gate 240 in the following thermal drive-in step. Thus, as shown in FIG. 2E, after the formation of the body 250' and the source region 270, the dielectric layer 232 on the silicon substrate 210 can be used as the mask for forming the self-aligned silicide layer 285 on the polysilicon gate 240.

Figure 3A:
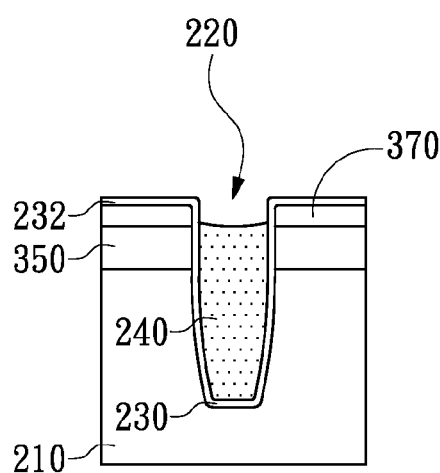
FIGS. 3A to 3C are schematic cross-section views showing a fabrication method of a trenched power semiconductor structure with reduced gate impedance in accordance with a second embodiment of the present invention.
Figure 3B:
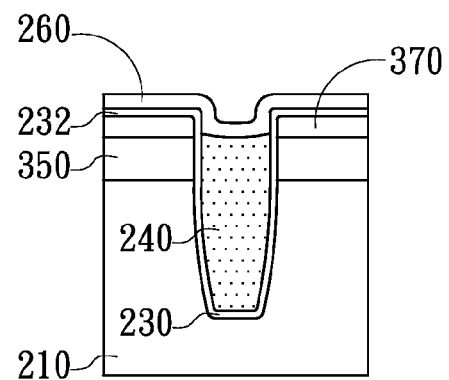
Figure 3C:
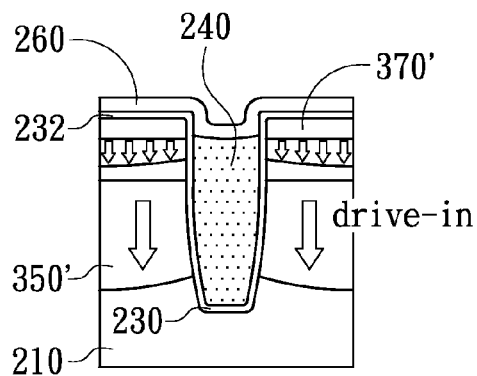

FIGS. 3A to 3C are schematic cross-section views showing a fabrication method of a trenched power semiconductor structure in accordance with a second embodiment of the present invention. Referring to FIG. 3C, in contrast with the first embodiment of the present invention, which has the isolation layer 260 formed right after the first conductive type dopants being implanted into the substrate 210, the present embodiment applies another ion implantation step for implanting second conductive type dopants into the substrate 210 before the formation of the isolation layer. According the present embodiment, a deeper first doped region 350 and a shallower second doped region 370 are formed in the substrate 210 after the two ion implantation steps, wherein the first doped region 350 is of the first conductive type and the second doped region 370 is of the second conductive type.

Next, as shown in FIG. 3B, an isolation layer 260 is comformally deposited on the silicon substrate 210 and the polysilicon gate 240. Then, as shown in FIG. 3C, a thermal drive-in step is performed focusing on both the dopants in the first doped region 350 and the second doped region 370. As indicated by the arrow, the dopants within the first doped region 350 are diffused downward to form the body 350' surrounding the polysilicon gate 240, and the dopants within the second doped region 370 are diffused downward to form the source region 370' at the source region of the silicon substrate 210.

Figure 4A:
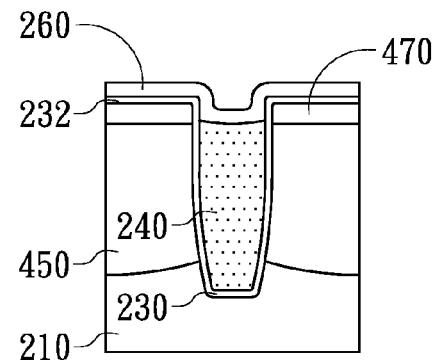
FIGS. 4A to 4C are schematic cross-section views showing a fabrication method of a trenched power semiconductor structure with reduced gate impedance in accordance with a third embodiment of the present invention.
Figure 4B:
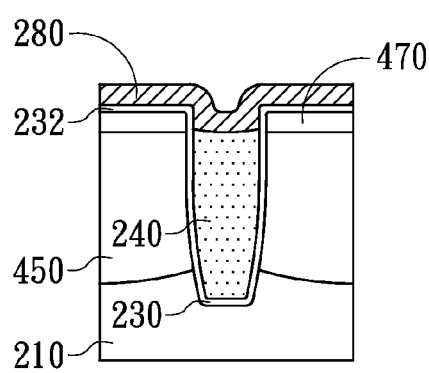
Figure 4C:
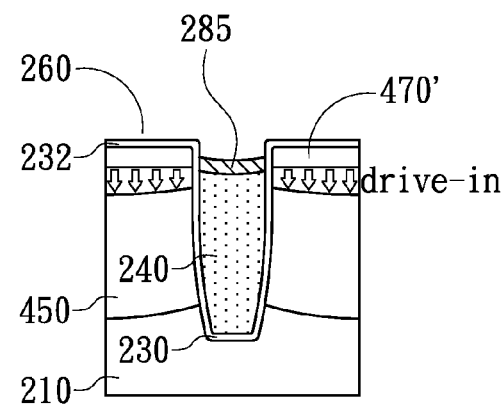

FIGS. 4A to 4C are schematic cross-section views showing a fabrication method of a trenched power semiconductor structure in accordance with a third embodiment of the present invention. The fabrication step of FIG. 4A is next to the fabrication step as shown in FIG. 2C. As shown in FIG. 4A, after the formation of the body 450 surrounding the polysilicon gate 240, dopants of second conductive type are implanted into the body 450 through the dielectric layer 232 and the isolation layer 260 so as to form a doped region 470 within the body 450.

Figure 2F:
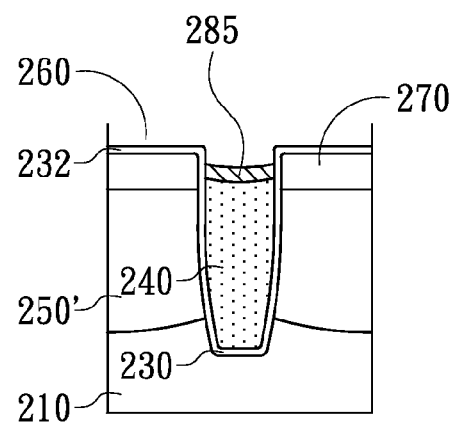

Next, as shown in FIG. 4B, the isolation layer 260 is removed to expose the dielectric layer 232 on the silicon substrate 210 and the upper surface of the polysilicon gate 240. Then a metal layer 280 is deposited on the dielectric layer 232 and the polysilicon gate 240. Afterward, as shown in FIG. 2F, an annealing process, such as the rapid thermal annealing (RTA) step, is carried out to have the metal layer 280 reacting with the polysilicon gate 240 so as to form the self-aligned silicide (salicide) layer 285 on the polysilicon gate 240. Meanwhile, the dopants within the doped region 470 are diffused downward to form the source region 470'. Thereafter, the unwanted portion of the metal layer 280 is removed. The following fabrication steps, such as the step of forming the source contact window, are not the patentable feature of the present invention, and thus are not described here.

Figure 5A:
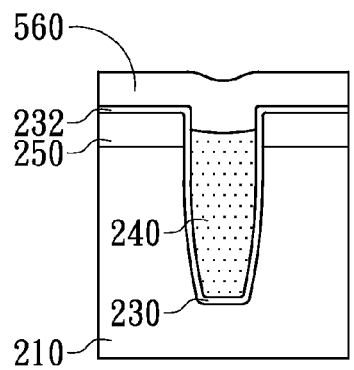
FIGS. 5A to 5D are schematic cross-section views showing a fabrication method of a trenched power semiconductor structure with reduced gate impedance in accordance with a fourth embodiment of the present invention.
Figure 5B:
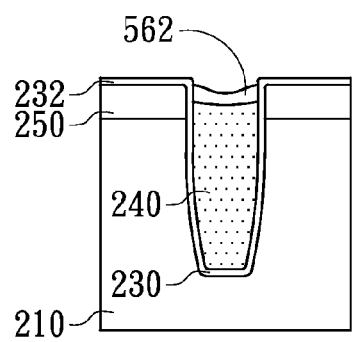

FIGS. 5A and 5B are schematic cross-section views showing a trenched power semiconductor structure with reduced gate impedance in accordance with a fourth embodiment of the present invention. The fabrication of FIG. 5A is next to the fabrication as shown in FIG. 2A. As shown in FIG. 5A, an isolation layer 560 is deposited on the silicon substrate 210 and the polysilicon gate 240 right after the ion implantation step for implanting first conductive type dopants into the substrate 210 to form the doped region 250. It is noted that, the thickness of the isolation layer 560 in accordance with the present embodiment is greater than that of the isolation layer 260 in the first embodiment of the present invention, and the gate trench 220 is filled with the isolation layer 560.

Next, as shown in FIG. 5B, the unwanted portion of the isolation layer 560, which is also the portion outside the gate trench 220, is removed by using etching back process so as to leave the portion 562 within the gate trench 220 and to have the dielectric layer 232 on the silicon substrate 210 exposed. To facilitate the etching back process, the dielectric layer 232 may be formed of silicon oxide and the isolation layer 560 may be formed of silicon nitride for the object of selectively removing the isolation layer 560. It is understood by persons skilled in the art that the composing materials of the dielectric layer 232 and the isolation layer 560 are not so restricted. Various dielectric materials suitable for the etching back process as indicated above can be applied in the present embodiment.

Figure 5C:
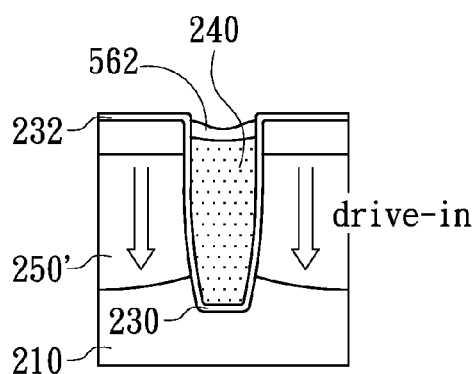
Figure 5D:
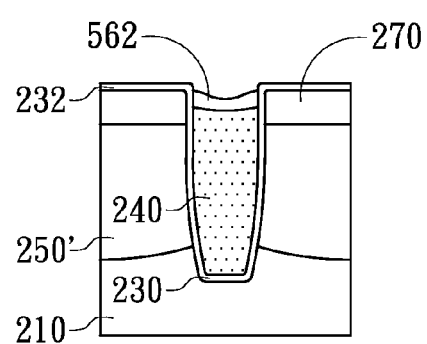

Next, as shown in FIG. 5C, a thermal drive-in step is performed focusing on the first conductive type dopants within the doped region 250 as indicated by the dashed line. After the thermal drive-in step, a body 250' is formed in the substrate 210 surrounding the polysilicon gate 240. Thereafter, as shown in FIG. 5D, dopants of second conductive type are implanted into the body 250' through the thin dielectric layer 232, and then another thermal drive-in step is performed to form the source region 270 in the silicon substrate 210. The following steps of the present embodiment are similar to that of the first embodiment, and thus are not repeated here.

In conclusion, the fabrication method provided in the present invention features the step of depositing the isolation layer 260 on the polysilicon gate 240 to isolate the polysilicon gate 240 from the environment ambient before the drive-in process, thus, the formation of silicon oxide layers on the polysilicon gate 240 during the drive-in process can be prevented. In addition, after the following steps of forming the body 250' and the source region 270, the remained dielectric layer 232 on the upper surface of the silicon substrate 210 can be utilized as the mask for forming the self-aligned silicide (salicide) layer 285 on the polysilicon gate 240. Thus, the fabrication method provided in the present invention is capable to simplify the process for forming the self-aligned silicide, which is helpful for reducing gate impedance of power transistors.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A fabrication method of a power semiconductor structure with reduced gate impedance comprising:
   a) forming a polysilicon gate in a substrate comprising the steps of:
   forming a gate trench in the substrate;
   forming a dielectric layer at least on an inner surface in the gate trench; and
   forming the polysilicon gate in the gate trench;
   b) implanting dopants into the substrate with the substrate being partially shielded by the polysilicon gate;
   c) forming an isolation layer covering the polysilicon gate;
   d) applying a thermal drive-in process to form at least a body surrounding the polysilicon gate,
   wherein the isolation layer deposited on the polysilicon gate substantially prevents the formation of silicon oxide on the polysilicon gate during the thermal drive-in step;
   e) removing the isolation layer to expose the polysilicon gate;
   f) depositing a metal layer on the dielectric layer and the polysilicon gate; and
   g) forming a self-aligned silicide layer on the polysilicon gate by using a thermal process.

2. The fabrication method of a power semiconductor structure with reduced gate impedance as claimed in claim 1, wherein the step of implanting dopants into the substrate comprises:
   implanting dopants of a first conductive type into the substrate; and
   implanting dopants of a second conductive type into the substrate;
   wherein the implanted first conductive type dopants are diffused to form the body and the implanted second conductive type dopants are diffused to form a source region through the thermal drive-in process.

3. The fabrication method of a power semiconductor structure with reduced gate impedance as claimed in claim 1, wherein the step of implanting dopants into the substrate is to implant dopants of a first conductive type into the body, and the implanted first conductive type dopants are diffused to form the body through the thermal drive-in process.

4. The fabrication method of a power semiconductor structure with reduced gate impedance as claimed in claim 3, after the step of forming the body and before the step of removing the isolation layer, further comprises the step of implanting dopants of a second conductive type into the body.

5. The fabrication method of a power semiconductor structure with reduced gate impedance as claimed in claim 4, after the step of implanting the dopants of the second conductive type, further comprises the step of applying another thermal driving-in process to form a source region in the body.

6. The fabrication method of a power semiconductor structure with reduced gate impedance as claimed in claim 1, wherein the isolation layer is formed of silicon nitride.

7. The fabrication method of a power semiconductor structure with reduced gate impedance as claimed in claim 1, wherein the dielectric layer is formed of silicon oxide.

8. The fabrication method of a power semiconductor structure with reduced gate impedance as claimed in claim 1, wherein the isolation layer is comformally formed on the substrate and the polysilicon gate.

9. The fabrication method of a power semiconductor structure with reduced gate impedance as claimed in claim 1, wherein the step of forming the isolation layer covering the polysilicon gate comprises:
   depositing isolation material on the substrate and the polysilicon gate to fill the gate trench; and
   removing an unwanted portion of the isolation material by using an etching back process to leave the isolation layer within the gate trench.

* * * * *